US011550737B2

(12) United States Patent
Byron

(10) Patent No.: US 11,550,737 B2
(45) Date of Patent: Jan. 10, 2023

(54) ADJUSTING CHARACTERISTIC OF SYSTEM BASED ON PROFILE

(71) Applicant: Micron Technology, Inc., Boise, ID (US)

(72) Inventor: Brent Carl Byron, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 180 days.

(21) Appl. No.: 16/528,315

(22) Filed: Jul. 31, 2019

(65) Prior Publication Data

US 2021/0034553 A1 Feb. 4, 2021

(51) Int. Cl.
*G06F 13/16* (2006.01)
*G11C 11/4072* (2006.01)
*G06F 12/0879* (2016.01)
*G06F 12/02* (2006.01)

(52) U.S. Cl.
CPC ...... *G06F 13/1668* (2013.01); *G06F 12/0246* (2013.01); *G06F 12/0879* (2013.01); *G11C 11/4072* (2013.01)

(58) Field of Classification Search
CPC ............. G06F 13/1668; G06F 12/0879; G06F 12/0246; G11C 11/4072; G11C 7/1093; G11C 7/1066; G11C 7/10
See application file for complete search history.

(56) References Cited

U.S. PATENT DOCUMENTS

| | | | |
|---|---|---|---|
| 9,070,481 B1* | 6/2015 | Ellis | G06F 11/3409 |
| 10,402,272 B2* | 9/2019 | Liikanen | G06F 11/142 |
| 10,831,384 B2* | 11/2020 | Myers | G06F 3/0688 |
| 2002/0019584 A1* | 2/2002 | Schulze | A61B 5/0022 |
| | | | 600/300 |
| 2004/0203768 A1* | 10/2004 | Ylitalo | H04M 1/72457 |
| | | | 455/435.1 |
| 2013/0232289 A1* | 9/2013 | Zhong | G06F 11/1008 |
| | | | 711/102 |
| 2013/0297907 A1* | 11/2013 | Ki | G06F 12/0684 |
| | | | 711/170 |
| 2018/0160294 A1* | 6/2018 | Lee | H04W 12/35 |
| 2018/0260158 A1* | 9/2018 | Marripudi | G06F 11/34 |
| 2019/0065080 A1* | 2/2019 | Tanpairoj | G06F 3/061 |

* cited by examiner

*Primary Examiner* — Tasnima Matin
(74) *Attorney, Agent, or Firm* — Schwegman Lundberg & Woessner, P.A.

(57) ABSTRACT

Various embodiments described herein provide for operation of a memory sub-system based on a profile (also referred to herein as an operational profile) that causes the memory sub-system to have a specific set of operational characteristics. Additionally, some embodiments can provide dynamic switching between profiles based on a set of conditions being satisfied, such as current time of day or detection of a particular data input/out (I/O) pattern with respect to the memory sub-system.

20 Claims, 6 Drawing Sheets

ADJUSTING CHARACTERISTIC OF SYSTEM BASED ON PROFILE

TECHNICAL FIELD

Embodiments of the disclosure relate generally to memory and more specifically, to memory operation based on a profile.

BACKGROUND

A memory sub-system can be a storage system, such as a solid-state drive (SSD), and can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
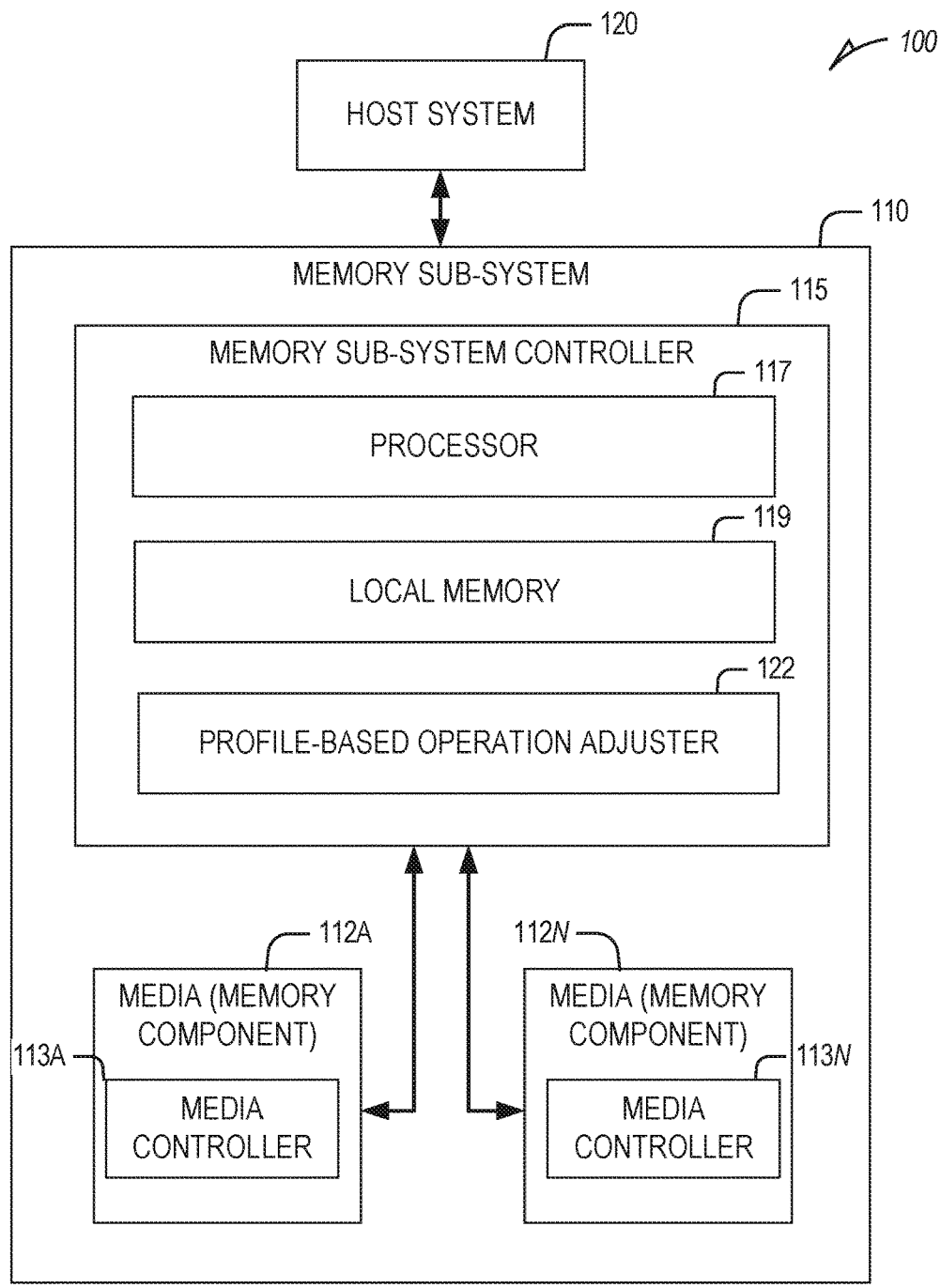
FIG. 1 is a block diagram illustrating an example computing environment including a memory sub-system, in accordance with some embodiments of the present disclosure.

Aspects of the present disclosure are directed to a memory operation based on a profile, which may be used by or as part of a memory sub-system. A memory sub-system is also hereinafter referred to as a "memory device." An example of a memory sub-system is a storage system, such as an SSD. In some embodiments, the memory sub-system is a hybrid memory/storage sub-system. In general, a host system can utilize a memory sub-system that includes one or more memory components. The host system can provide data (e.g., via write requests) to be stored at the memory sub-system and can request data to be retrieved (e.g., via read requests) from the memory sub-system.

A memory sub-system can include multiple memory components that can store data from the host system. The memory sub-system can further include a memory sub-system controller that can communicate with each of the memory components to perform operations such as reading data, writing data, or erasing data at the memory components in response to requests received from the host system. Any one or more of the memory components of the memory sub-system may include a media controller to manage memory cells of the memory component, communicate with the memory sub-system controller, and execute memory requests (e.g., read or write) received from the memory sub-system controller.

Various embodiments described herein provide for operation of a memory sub-system (e.g., SSD) based on a profile (also referred to herein as an operational profile) that causes the memory sub-system to have a specific set of operational characteristics. Additionally, some embodiments can provide activation of a particular profile based on a set of conditions associated with the particular profile being satisfied or switching (e.g., automatic or dynamic switching) between profiles based on a set of conditions being satisfied. A set of conditions can include, for example, current time of day or detection (e.g., by the memory sub-system or by a host) of a particular data input/out (I/O) pattern with respect to the memory sub-system.

According to some embodiments, while a memory sub-system is powered, the memory sub-system can receive a request (e.g., a command from a host system) for the memory sub-system to change to a particular operational profile, which can cause the memory sub-system to switch from its current operational profile being active to the particular operational profile being active. As used herein, when active, a profile or operational profile can cause a memory sub-system to operate according to a set of operational characteristics. Depending on the embodiment, activating a particular operational profile can cause one or more setting changes for the memory sub-system, such as a change (e.g., adjustments or updates) to a table (e.g., firmware table) of the memory sub-system, a change to a variable (e.g., internal variable) of the memory sub-system, movement of data of the memory sub-system, remapping of data of the memory sub-system, or enablement/disablement of a component (e.g., data cache space) of the memory sub-system. One or more of these activities can enable the memory sub-system to achieve a target set of operational characteristics associated with the particular operational profile. Once a particular operational profile is activated (e.g., successfully activated), a variable (e.g., internal variable) of the memory sub-system stored on non-volatile memory can be set (e.g., updated) to represent activation of the particular operational profile, which can ensure that the particular operational profile is reloaded by the memory sub-system in the event of a reboot or power loss to the memory sub-system. The non-volatile memory can include, for example, NAND or NOR memory. The non-volatile memory can be separate from the memory used for user data. Additionally, after a particular operational profile is activated based on a request (e.g., from a host system), some embodiments respond to the request by sending a response (e.g., to the host system) that confirms success or completion of the request (e.g., success of the command). Alternatively, if activation of the particular operational profile fails, some embodiments respond to the request by sending a response (e.g., to the host system) that indicates failure of the request (e.g., failure of the command), such as a code indicating an abort protocol if no operational profile is available or the requested operational profile is not available.

For some embodiments, a request to a memory sub-system to activate or change to a given operational profile comprises a command, such as a profile activation command. For example, the request to activate/change to an operational profile can be implemented using at least one of a vendor-unique command or a vendor-reserved feature setting, such as a vendor-specific (VS) command or a user-defined command set available in accordance with an AT Attachment (ATA) specification (e.g., Serial ATA set feature command). For some such embodiments, a memory sub-system (e.g., SSD) receives the vendor-unique command or vendor-reserved feature setting from a customer host system that is using the memory sub-system for operation. Additionally, the request can specify (e.g., a number) corresponding to a given operational profile being selected for activation, and can further specify a set of sub-settings (e.g., cache size for read or write operations) to be used with respect to the given operational profile.

An example of a command for changing to a given operational profile (e.g., performance profile) can be based on the ATA ACS-4 specification. For instance, for some embodiments, a set feature command with sub-command field set to a specific value corresponding to a vendor specific code (e.g., 56$h$) can be interpreted by a memory sub-system (e.g., controller of the memory sub-system) as an operational profile setting or activation command. The count and LB A fields of the set feature command can be used to convey a numeric value corresponding to a particular operational profile of choice and, further, any sub-settings (e.g., count field=high performance mode, LBA field=sub-setting value specifying a SLC cache size for use by the memory sub-system while operating according to operational characteristics of high-performance mode).

According to various embodiments, a host system can access (e.g., activate) one of multiple operational profiles available on a given memory sub-system and associated with different sets of operational characteristics for the given memory sub-system. Additionally, the host system can access (e.g., activate) one of multiple operational profiles of the memory sub-system without needing to load new firmware onto the memory sub-system. This can obviate the need for a customer to purchase new memory sub-system hardware to obtain different operational characteristics.

Depending on the embodiment, a set of operational profiles can be stored on the memory sub-system in a table (e.g., a table of performance profiles) or some other data structure. For instance, a request (e.g., command) can be sent to a memory sub-system to activate or change to a given operational profile stored in a table of the memory sub-system, and the request can comprise a value (e.g., numerical value) that references a row or column of the table associated with the given operational profile and storing information for activating the given operational profile on the memory sub-system. The information can include, for instance, a set of values for variables, parameters, or settings of the memory sub-system that affect a set of more operational characteristics of the memory sub-system. For example, a value can include one that enables or disables a cache, a value specifying a size of a data cache of the memory sub-system, a value for enabling or disabling slowed/delayed data write speed (e.g., value determines whether delays are injected between write operations), a value to determine the level by which to slow/delay data write speed, and the like. Alternatively, the information for the given operational profile can be stored in a file or other data object stored on the memory sub-system. Storage of the set of operational profiles can be stored in reserved memory space (e.g., SLC) of the memory sub-system, which can be separate from operational memory of the memory sub-system.

Examples of profiles (e.g., performance profiles) used by a memory sub-system of some embodiments include, without limitation, a balanced mode, a sequential write mode, a consistency mode, a read intensive mode, an endurance mode, and a low-power mode. For instance, when activated, a balanced mode profile can cause a memory sub-system to have a set of operational characteristics that balances the memory sub-system's power usage, with consistency of operation speed. (e.g., read/write speed), and data throughput for data workloads (hereafter, workloads) of users. Such profile can be useful for when the memory sub-system is being used with a workload with unpredictable demands (e.g., read/write demands). When activated, a sequential write mode can cause a memory sub-system to have a set of operational characteristics that supports high write throughput to the memory sub-system for large sequential data transfers, which may be at the expense increased overall power usage, increased operation (e.g., read) latency and decrease in operation consistency. When activated, a consistency mode can cause a memory sub-system to have a set of operational characteristics that provides low operation (e.g., read) latency and low relative standard deviation (RSD), which may be at the expense of lowering or limiting write throughput to the memory sub-system. When activated, a read-intensive mode can cause a memory sub-system to have a set of operational characteristics that services read operations (e.g., commands) as a priority in all workloads, which can result in a lower write performance and can result in non-media commands being slower to respond. When activated, an endurance mode can cause a memory sub-system to have a set of operational characteristics that handles workloads to improve (e.g., increase) the life of a memory sub-system (e.g., SSD). Additionally, when activated, a low-power mode can cause a memory sub-system to have a set of operational characteristics that provides low power usage by the memory sub-system and reasonable write throughput for workloads that are sensitive to power usage, which may be at the expense of lower overall performance by the memory sub-system.

Some embodiments can be used in applications where a user (e.g., customer) is using memory sub-systems with multiple host systems (e.g., in a single data center) having different use cases. For example, a first set of host systems can provide data backup services, which could benefit from memory sub-systems that have a set of operational characteristics suitable for periodic large data transfer size workloads involving sequential writes, and a second set of host systems can provide data analysis services, which could benefit from memory sub-systems that have a set of operational characteristics suitable for random small data transfer size workloads involving reads, writes, or both. In such an example, a single memory sub-system product offering (e.g., single SKU) can be used to service the data storage needs of the multiple host systems.

Some embodiments can be used in applications where a user (e.g., customer) is using memory sub-systems for different known workloads at different times of the day. For example, during the day, a host system that provides streaming content could benefit by using a memory sub-system having a set of operational characteristics suitable for high-throughput read workloads (to facilitate content streaming to end users). During the evening, a host system (e.g., the same host system that provides streaming content or another host system) can load the memory sub-system with new data content (e.g., based on end user streaming demand), and that host system could benefit from the memory sub-system having a set of operational characteristics suitable for write-intensive workloads. In this way, some embodiments can enable a memory sub-system to implement balance or maximize performance trade-offs for different or changing workloads the memory sub-system may need to handle.

Some embodiments can be used in applications where a supplier (e.g., manufacturer or OEM) of memory sub-systems can adjust a set of operational characteristics of a single memory sub-system product offering (e.g., single SKU) to suit the use cases of a downstream customer. In this way, various embodiments can enable a memory sub-system supplier to service multiple customer types with the single memory sub-system product offering, can reduce a total number of memory sub-system product offerings that are built or managed, and can obviate the need to maintain multiple firmware for a single memory sub-system hardware.

By using various embodiments, a specific memory sub-system (e.g., SSD) hardware configuration can support multiple stock keeping units (SKUs) associated with different memory sub-systems (product offerings) each having different product features or performance characteristics. In doing so, various embodiments can avoid development cost, potential product waste, and need for producing or supporting different memory sub-system hardware SKUs, each of which can consume separate production resources (e.g., each hardware SKU requires separate testing or validation processes). Embodiments described herein can support different memory sub-system firmware for different customers using the same memory sub-system hardware SKU. Additionally, embodiments described herein can support memory sub-system firmware that anticipates or balances performance for different workloads using the same memory sub-system hardware. For instance, by use of some embodiments, particular memory sub-system hardware can flexibly (e.g., dynamically) support trade-offs between performance metrics, such as for read-intensive workloads (e.g., ones that do not need to be balanced with good write performance at all times) and for workloads that change over time (e.g., balanced read and write during the day time, and read-intensive during the evening time). Furthermore, embodiments described herein can enable a customer (e.g., one who is unsure of their own workload needs) to test different performance modes without reloading different memory sub-systems or firmware (e.g., SSDs).

Disclosed herein are some examples of systems that include or use a memory operation based on a profile, as described herein.

FIG. 1 illustrates an example computing environment 100, including a memory sub-system 110, in accordance with some examples of the present disclosure. The memory sub-system 110 can include media, such as memory components 112A to 112N. The memory components 112A to 112N can be volatile memory devices, non-volatile memory devices, or a combination of such. In some embodiments, the memory sub-system 110 is a storage system. An example of a storage system is an SSD. In some embodiments, the memory sub-system 110 is a hybrid memory/storage system. In general, the computing environment 100 can include a host system 120 that uses the memory sub-system 110. For example, the host system 120 can write data to the memory sub-system 110 and read data from the memory sub-system 110.

The host system 120 can be a computing device such as a desktop computer, laptop computer, network server, mobile device, or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. As used herein, "coupled to" generally refers to a connection between components, which can be an indirect communicative connection or a direct communicative connection (e.g., without intervening components), whether wired or wireless, including connections such as electrical, optical, magnetic, and so forth. Examples of a physical host interface include, but are not limited to, a serial advanced technology attachment (SATA) interface, a peripheral component interconnect express (PCIe) interface, a universal serial bus (USB) interface, a Fibre Channel interface, a Serial Attached SCSI (SAS) interface, etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface. The physical host interface can provide an interface for passing control, address, data, and other signals between the memory sub-system 110 and the host system 120.

The memory components 112A to 112N can include any combination of the different types of non-volatile memory components and/or volatile memory components. An example of non-volatile memory components includes a negative-and (NAND)-type flash memory. Each of the memory components 112A to 112N can include one or more arrays of memory cells such as single-level cells (SLCs) or multi-level cells (MLCs) (e.g., TLCs or QLCs). In some embodiments, a particular memory component 112 can include both an SLC portion and an MLC portion of memory cells. Each of the memory cells can store one or more bits of data (e.g., data blocks) used by the host system 120. Although non-volatile memory components such as NAND-type flash memory are described, the memory components 112A to 112N can be based on any other type of memory, such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magnetoresistive random access memory (MRAM), negative-or (NOR) flash memory, electrically erasable programmable read-only memory (EEPROM), and a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write-in-place operation, where a non-volatile memory cell can be programmed without the non-volatile memory cell being previously erased. Furthermore, the memory cells of the memory components 112A to 112N can be grouped as memory pages or data blocks that can refer to a unit of the memory component 112 used to store data.

The memory sub-system controller 115 can communicate with the memory components 112A to 112N to perform operations such as reading data, writing data, or erasing data at the memory components 112A to 112N and other such operations. The memory sub-system controller 115 can include hardware such as one or more integrated circuits and/or discrete components, a buffer memory, or a combination thereof. The memory sub-system controller 115 can be a microcontroller, special-purpose logic circuitry (e.g., a field programmable gate array (FPGA), an application-specific integrated circuit (ASIC), etc.), or another suitable processor. The memory sub-system controller 115 can include a processor (processing device) 117 configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, and so forth. The local memory 119 can also include read-only memory (ROM) for storing microcode. While the example memory sub-system 110 in FIG. 1 has been illustrated as including the memory sub-system controller 115, in another embodiment of the present disclosure, a memory sub-system 110 may not include a memory sub-system controller 115, and can instead rely upon external control (e.g., provided by an external host, or by a processor or controller separate from the memory sub-system 110).

In general, the memory sub-system controller 115 can receive commands or operations from the host system 120 and can convert the commands or operations into instructions or appropriate commands to achieve the desired access to the memory components 112A to 112N. The memory sub-system controller 115 can be responsible for other operations such as wear leveling operations, garbage collection operations, error detection and error-correcting code (ECC) operations, encryption operations, caching operations, and address translations between a logical block address and a physical block address that are associated with the memory components 112A to 112N. The memory sub-system controller 115 can further include host interface circuitry to communicate with the host system 120 via the physical host interface. The host interface circuitry can convert the commands received from the host system 120 into command instructions to access the memory components 112A to 112N as well as convert responses associated with the memory components 112A to 112N into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory components 112A to 112N.

Any one of the memory components 112A to 112N can include a media controller (e.g., media controller 113A and media controller 113N) to manage the memory cells of the memory component 112, to communicate with the memory sub-system controller 115, and to execute memory requests (e.g., read or write) received from the memory sub-system controller 115.

The memory sub-system controller 115 includes a profile-based operation adjuster 122 that enables the memory sub-system controller 115 to activate an operational profile that causes the memory sub-system 110 to have a specific set of operational characteristics, particularly with respect to reading or writing data with respect to the memory components 112A to 112N. For some embodiments, the memory sub-system controller 115 receives a request from the host system 120 to activate switch to) an operational profile available on the memory sub-system 110. The request can take the form of an ATA command issued by the host system 120 to the memory sub-system controller 115, and the operational profile selected for activation can be one (e.g., of a plurality of operational profiles) described in a data structure (e.g., profile table) stored on non-volatile memory of the memory sub-system 110, such as non-volatile memory reserved for use by the memory sub-system controller 115. For some embodiments, the local memory 119 of the memory sub-system controller comprises this non-volatile memory. As described herein, activation of the requested operational profile can cause one or more setting changes for the memory sub-system 110, such as a change (e.g., adjustments or updates) to a table (e.g., firmware table) of the memory sub-system 110, a change to a variable (e.g., internal variable) of the memory sub-system 110, movement of data of the memory sub-system 110, remapping of data of the memory sub-system 110, or enablement/disablement of a component (e.g., data cache space) of the memory sub-system 110. For various embodiments, one or more of these activities can enable the memory sub-system 110 to achieve a target set of operational characteristics associated with the requested operational profile. Once a requested operational profile is activated, an indication of this activation can be stored on the memory sub-system 110 stored on non-volatile memory (e.g., update internal variable to represent activation of the requested operational profile), which can ensure that the requested operational profile is reloaded by the memory sub-system 110 in the event of a reboot or power loss to the memory sub-system 110. Eventually, the memory sub-system 110 can generate and send the host system 120 a response to the request, where the response comprises a status of the request. Examples of request status can include, without limitation, success (e.g., success of command execution) or failure (e.g., abort protocol).

For some embodiments, the profile-based operation adjuster 122 determines (e.g., detects) whether a set of conditions associated with a particular operational profile is satisfied and, responsive to the set of conditions being satisfied, activates the particular operational profile. The determination can be performed periodically (e.g., based on a user-definable parameter). Where another operational profile is currently active, activation of the particular operational profile by the profile-based operation adjuster 122 causes a switch from the other operational profile to the particular operational profile. In this way, the profile-based operation adjuster 122 can enable automatic/dynamic activation of operational profiles based on one or more conditions being monitored by the profile-based operation adjuster 122. Examples of conditions can include, without limitation, data, time, time zone, detection of errors/faults, or detection of a particular data pattern with respect to input/out (I/O) of the memory sub-system 110.

Figure 2:
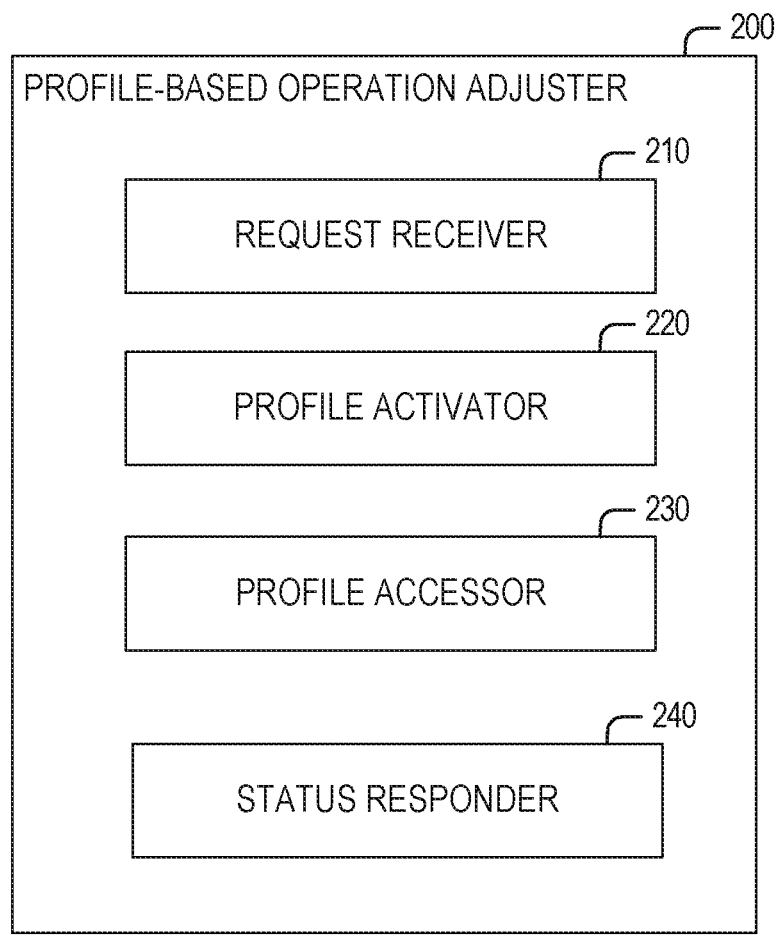
FIG. 2 is a block diagram of an example profile-based operation adjuster, in accordance with some implementations of the present disclosure.

FIG. 2 is a block diagram of an example profile-based operation adjuster 200, in accordance with some implementations of the present disclosure. As shown, the profile-based operation adjuster 200 comprises a request receiver 210, a profile activator 220, a profile accessor 230, and a status responder 240. For some embodiments, the profile-based operation adjuster 200 may differ in components or arrangement (e.g., fewer or more components) than what is illustrated in FIG. 2.

The request receiver 210 receives a request for activating a particular operational profile for a memory sub-system. For some embodiments, the request comprises a command that specifies the particular operational profile (e.g., by a numeric value corresponding to a row on a profile table), and the command can further specify a set of setting values that can be further implemented in connection with the activation of the particular operational profile (e.g., cache size value for a high-performance mode profile). The request can be one received from a host system and, additionally, can be one that is received from the host system by a memory sub-system controller of a memory sub-system.

For some embodiments, the profile activator 220 attempts to activate a particular operational profile based on (e.g., specified by) a request received by the request receiver 210. Additionally, for some embodiments, the profile activator 220 attempts to activate a particular operational profile based on a set of conditions associated with the particular operational profile. In attempting to activate the particular operational profile, the profile activator 220 can initially determine (e.g., via the profile accessor 230) the existence or availability of the particular operational profile on the non-volatile memory. If the particular operational profile is missing or unavailable, the profile activator 220 can inform (e.g., via the status responder 240) the requestor (e.g., the host system) that activation of the particular operational profile has failed. Alternatively, if the particular operational profile is available for use, the profile activator 220 can adjust a set of operational characteristics of the memory sub-system based on the particular operational profile. After successful completion of the adjusting, the profile activator 220 stores an indication (e.g., sets an internal variable) that the particular operational profile is active. Eventually, the profile activator 220 can inform (e.g., via the status responder 240) the requestor (e.g., the host system) of the successful activation of the particular operational profile.

The profile accessor 230 provides the profile-based operation adjuster 200 with access to a set of operational profiles for a memory sub-system. For some embodiments, the profile accessor 230 facilitates reading one or more operational profiles from non-volatile memory (e.g., reserved memory space) used by the memory sub-system to store operational profiles available for use (e.g., activation) by the profile-based operation adjuster 200. Additionally, for some embodiments, the profile accessor 230 facilitates management of a set of operational profiles on a memory sub-system, which can include adding a new operational profile, removing an existing operational profile, or updating an existing operational profile with respect to a set of operational profiles available and stored on the non-volatile memory of the memory sub-system. As described herein, the set of operational profiles available to the profile-based operation adjuster 200 can be stored in a table (or other data structure), where the table can include information that is associated with those operational profiles and used by the profile-based operation adjuster 200 to activate a given operational profile of the set. For instance, the information of the given operational profile can include values for variables and settings which, when implemented by the profile-based operation adjuster 200, causes the memory sub-system to have a target set of operational characteristics associated with the given operational profile.

The status responder 240 sends a response to the origin of the request received by the request receiver 210. For some embodiments, the response comprises a status (e.g., success or failure) of the request. For example, where the request comprises a command, the response can comprise a command code representing successful completion of the command or representing a failure or error with respect to the command (e.g., in accordance with an ATA command specification).

Figure 3:
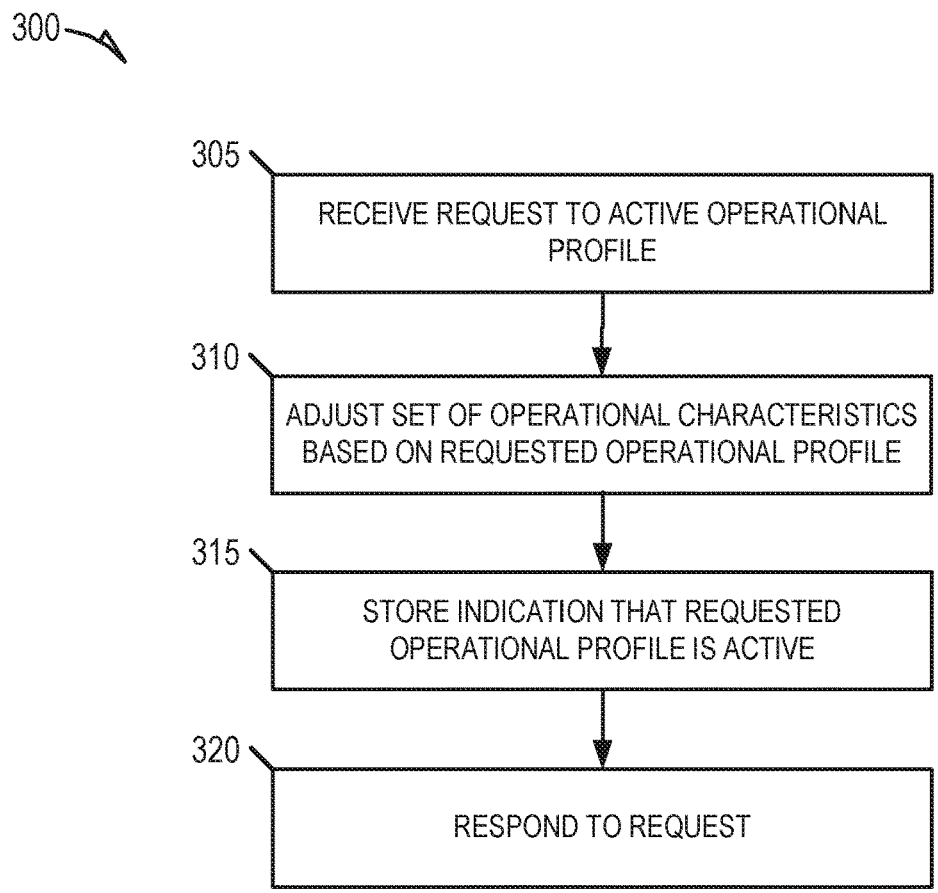
FIGS. 3 and 4 are flow diagrams of example methods for adjusting operation of a memory sub-system based on an operational profile, in accordance with some implementations of the present disclosure.
Figure 4:
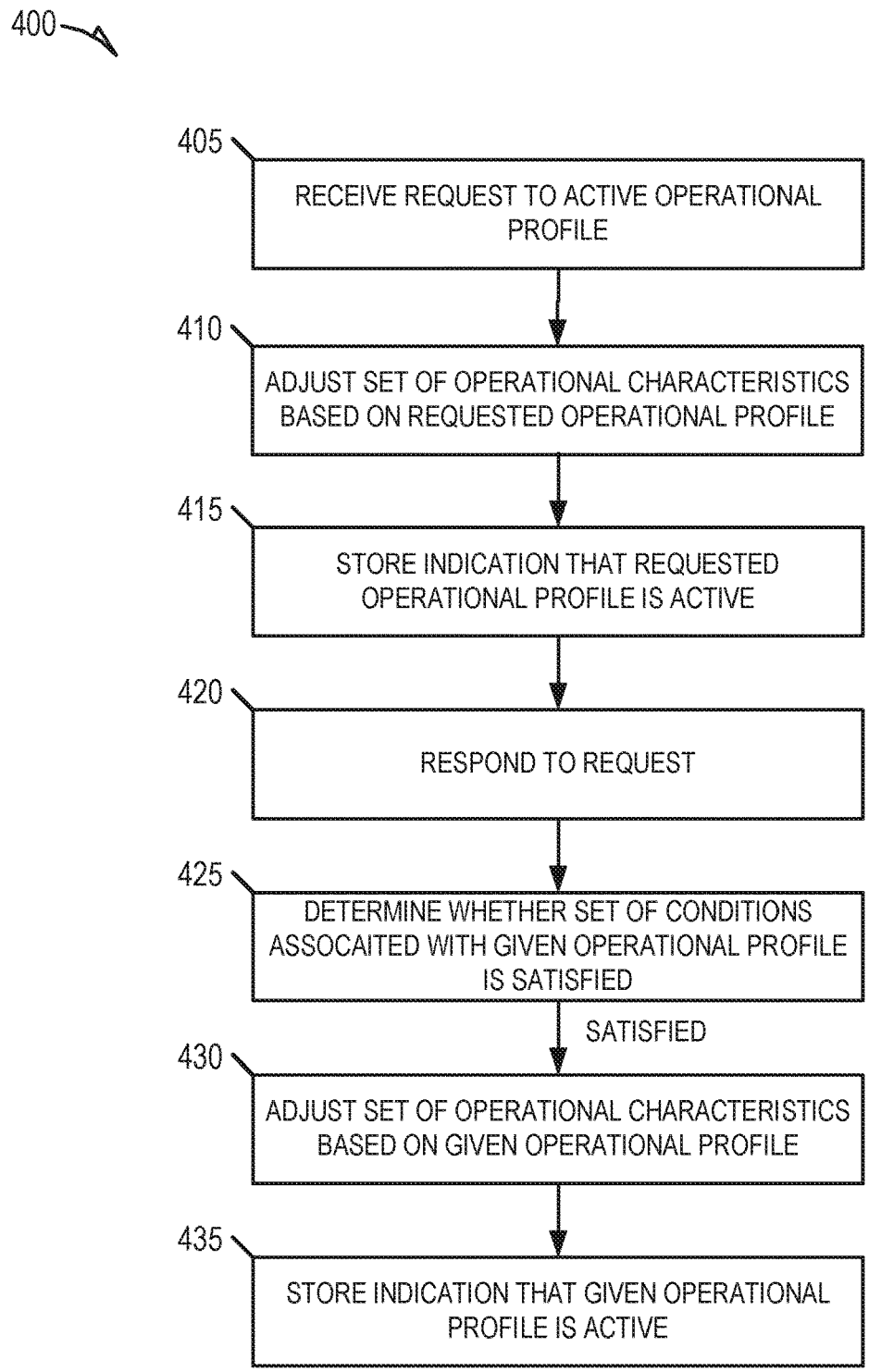

FIGS. 3 and 4 are flow diagrams of an example methods for adjusting operation of a memory sub-system based on an operational profile, in accordance with some implementations of the present disclosure. Any of methods 300, 400 of FIGS. 3 and 4 can be performed by processing logic that can include hardware (e.g., a processing device, circuitry, dedicated logic, programmable logic, microcode, hardware of a device, an integrated circuit, etc.), software (e.g., instructions run or executed on a processing device), or a combination thereof. In some embodiments, the method 300 is performed by the memory sub-system 110 of FIG. 1 (e.g., the processor 117 of the memory sub-system controller 115). In these embodiments, the methods 300, 400 can be performed, at least in part, by the profile-based operation adjuster 122. Alternatively, the method 300 is performed by the host system 120 of FIG. 1. Although the processes are shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

Referring now to the method 300 of FIG. 3, at operation 305, a processing device of a memory sub-system (e.g., memory sub-system controller 115) receives a request (e.g., from a requester, such as the host system 120) to activate an operational profile with respect to the memory sub-system. As described herein, for some embodiments, the request comprises an AT Attachment command. For instance, the request can comprise a set feature command in accordance with an ATA specification (e.g., ATA ACS-4 specification), where a sub-command field is set to a specific value corresponding to a vendor-specific code.

At operation 310, in response to the request, the processing device adjusts a set of operational characteristics of the memory sub-system based on the operational profile specified by the request received at operation 305. For some embodiments, the adjustment of the set of operational characteristics comprises setting a set of operation variables (or settings) of the memory sub-system based on information (e.g., stored in a profile table or other data structure) that corresponds to the operational profile. According to some embodiments, the set of operation variables implements at least some of the set of operational characteristics.

With respect to an example power-save operational profile, the operational profile can specify a set of values for a set of operation variables of the memory sub-system that cause the set of operational characteristics of the memory sub-system to comprise slow data write speed to the memory component. The set of values for the set of operation variables can, for instance, cause the memory sub-system to inject delays or only use a portion of non-volatile media to slow the write speed down. Additionally, when the operational profile is requested for activation, the request can include a setting value that controls to what level the memory sub-system slows down the write speed to the memory component.

With respect to an example read-intensive-mode operational profile, the operational profile can specify a set of values for a set of operation variables of the memory sub-system that cause the set of operational characteristics of the memory sub-system to comprise prioritizing a data read operation for the memory component over a data write operation for the memory component. The set of values for the set of operation variables can, for instance, cause the memory sub-system to suspend write commands received by the memory sub-system to service read commands received by the memory sub-system and, in doing so, the memory sub-system can service read commands as a priority in all workloads. As a result, the memory sub-system can operate as a read-centric drive that permits for higher read throughput.

Alternatively, with respect to an example write-intensive-mode operational profile, the operational profile can specify a set of values for a set of operation variables of the memory sub-system that cause the set of operational characteristics of the memory sub-system to comprise prioritizing a data write operation for the memory component over a data read operation for the memory component. The set of values for the set of operation variables can, for instance, cause the memory sub-system to suspend read commands received by the memory sub-system to service write commands received by the memory sub-system and, in doing so, the memory sub-system can service write commands as a priority in all workloads. As a result, the memory sub-system can operate as a write-centric drive, that permits for higher write throughput.

With respect to an example consistency-mode operational profile, the operational profile can specify a set of values for a set of operation variables of the memory sub-system that cause the set of operational characteristics of the memory sub-system to comprise disablement of burst mode write operation for the memory component. The set of values for the set of operation variables can, for instance, cause the memory sub-system to turn off a burst mode/bursting cache (e.g., a SLC cache) of the memory sub-system. In doing so, the memory sub-system can get more steady data performance instead of performance that includes periodic data bursts.

With respect to an example sequential-write-mode operational profile, the operational profile can specify a set of values for a set of operation variables of the memory sub-system that cause the set of operational characteristics of the memory sub-system to comprise enablement of sequential write mode operation for the memory component that permits high data throughput for large sequential data transfers to the memory sub-system.

With respect to an example endurance-mode operational profile, the operational profile can specify a set of values for a set of operation variables of the memory sub-system that cause the set of operational characteristics of the memory sub-system to comprise workload optimization for endurance of the system. For instance, the set of values for the set of operation variables can cause the memory sub-system to adjust settings on the memory components (e.g., trim settings of NAND non-volatile media of the memory components) such that write operations are slowed down (e.g., longer program time for NAND non-volatile media) but wear on the memory sub-system is slowed down (e.g., extends life of SSD).

With respect to an example consistency-mode operational profile, the operational profile can specify a set of values for a set of operation variables of the memory sub-system that cause the set of operational characteristics of the memory sub-system to comprise workload optimization for low latency and low RSD. For instance, the set of values for the set of operation variables can cause the memory sub-system to slow down input/output (IO) of one or more components of the memory sub-system to match 10 of one or more other components of the memory sub-system, thereby causing the memory sub-system to have less fluctuations and more time consistency during the memory sub-system's operation.

At operation 315, the processing device stores, on non-volatile memory of the memory sub-system, an indication that the operational profile is active. For some embodiments, the indication is stored with respect to an internal variable of the memory sub-system. The non-volatile memory can comprise, for example, NAND or NOR memory of the memory-sub-system.

At operation 320, the processing device responds to the request received at operation 305. For some embodiments, the request comprises a command, and the processing device responds to the requester (e.g., the host system) by sending a command code indicating whether the requested command was successful.

Referring now to the method 400 of FIG. 4, the method 400 begins with operations 405 through 420, which, according to some embodiments, are similar to operations 305 through 320 described above with respect to the method 300 of FIG. 3.

After operation 420, at operation 425, the processing device determines (e.g., detects) whether a set of conditions associated with a given operational profile (one that is different from the one requested at operation 405) is satisfied. Depending on the embodiment, the set of conditions can be, for example, to switch from a current/active operational profile to the given operational profile.

At operation 430, in response to the satisfaction of the set of conditions, the processing device adjusts the set of operational characteristics of the memory sub-system based on the given operational profile. At operation 435, the processing device stores, on non-volatile memory of the memory sub-system, an indication that the given operational profile is active. As described herein, the indication can be stored with respect to an internal variable of the memory sub-system.

Figure 5:
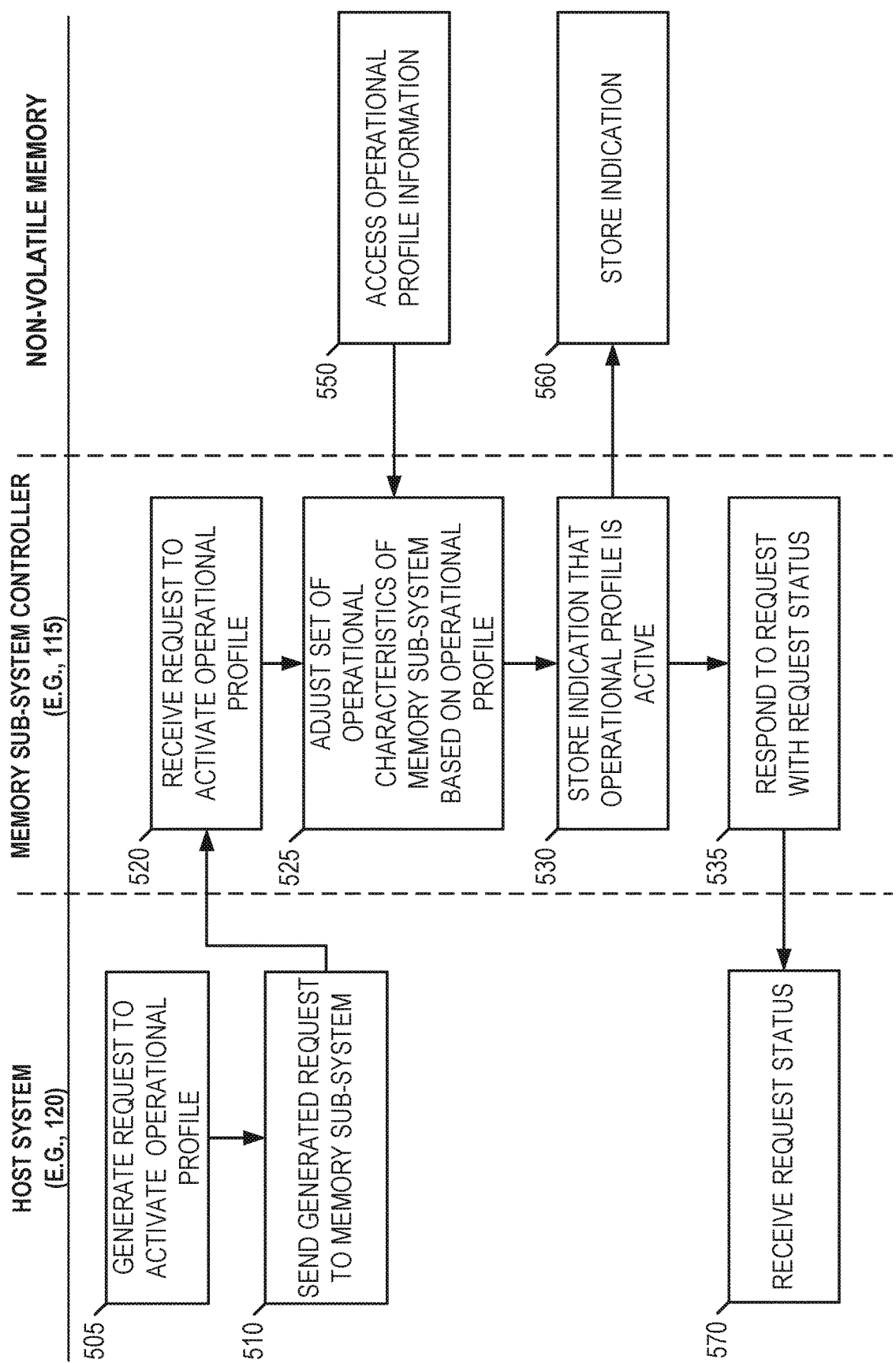
FIG. 5 provides an interaction diagram illustrating interactions between components of a computing environment in the context of an example embodiment in which a method for adjusting operation of a memory sub-system based on an operational profile is performed.

FIG. 5 provides an interaction diagram illustrating interactions between components of the computing environment 100 in the context of an example embodiment in which a method for adjusting operation of a memory sub-system based on an operational profile is performed. The operations of the method can be performed by processing logic that can include hardware (e.g., a processing device, circuitry, dedicated logic, programmable logic, microcode, hardware of a device, an integrated circuit, etc.), software (e.g., instructions run or executed on a processing device), or a combination thereof. In some embodiments, the method is performed by a host system (e.g., 120), a memory sub-system controller (e.g., 115), a non-volatile memory (e.g., 119) of the memory sub-system, or a combination thereof. Although the operations are shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment.

In the context of the example illustrated in FIG. 5, the host system can comprise the host system 120, the memory sub-system controller can comprise the memory sub-system controller 115 (of the memory sub-system 110), and the non-volatile memory can be part of the local memory 119.

As shown in FIG. 5, at operation 505, the host system 120 generates a request to activate (e.g., set or change to) a given operational profile of the memory sub-system 110. As described herein, the request can comprise an ATA command configured (e.g., with vendor-specific code) to activate the given operational profile of the memory sub-system 110. At operation 510, the host system 120 sends the generated request (e.g., command) to the memory sub-system 110 for processing and, at operation 520, the memory sub-system controller 115 receives the generated request. At operation 525, the memory sub-system controller 115 adjusts a set of operational characteristics of the memory sub-system 110 based on the given operational profile. At operation 550, the memory sub-system controller 115 accesses information (e.g., values for internal variables or parameters of the memory sub-system 110) associated with the given operational profile from the non-volatile memory, which can store a set of operational profiles available for use (e.g., activation) on the memory sub-system 110. As described herein, the set of operational profiles available for use can be stored in a data structure (e.g., table), which can be referenced in the table based on a value (e.g., numerical value) that corresponds to its location in the data structure row number).

At operation 530, upon successful adjustment of the set of operational characteristics (by operation 525), the memory subs-system controller 115 stores an indication that the given operational profile is active. Accordingly, at operation 560, the non-volatile memory stores the indication.

At operation 535, upon successful adjustment of the set of operational characteristics (by operation 525), the memory subs-system controller 115 further responds to the request (received at operation 520) with a request status, such as success or failure. As shown, the memory subs-system controller 115 can respond by sending the request status to the host system 120, which receives it at operation 570. For some embodiments, where the request comprises a command (e.g., ATA command), the memory sub-system controller 115 can respond to the request by sending a command code (e.g., ATA command code) to the host system 120, which can indicate the status of the command's execution at the memory sub-system 110.

Figure 6:
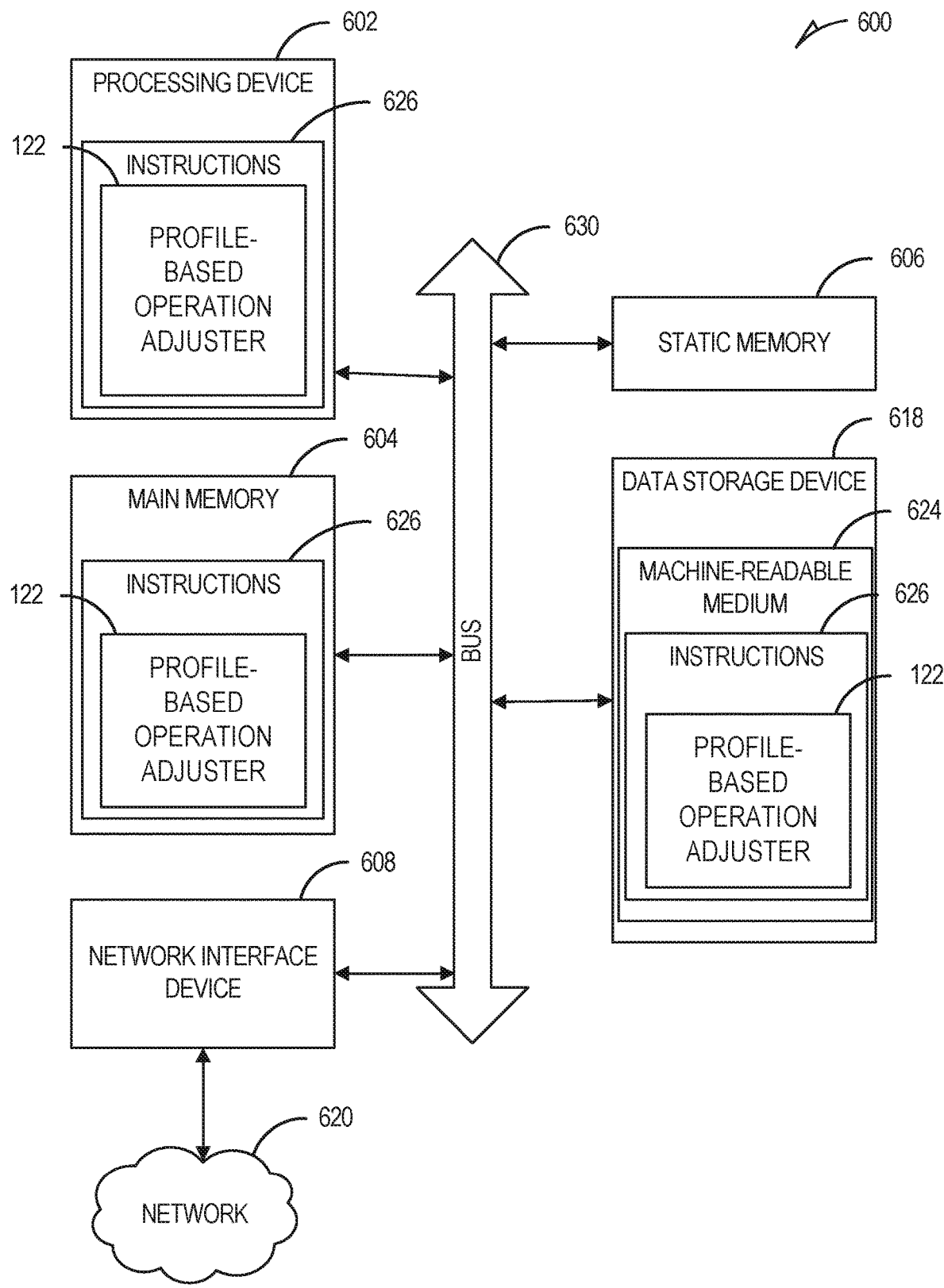
FIG. 6 is a block diagram illustrating a diagrammatic representation of a machine in the form of a computer system within which a set of instructions can be executed for causing the machine to perform any one or more of the methodologies discussed herein, in accordance with some embodiments of the present disclosure.

FIG. 6 illustrates an example machine in the form of a computer system 600 within which a set of instructions can be executed for causing the machine to perform any one or more of the methodologies discussed herein. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the profile-based operation adjuster 122 of FIG. 1). In alternative embodiments, the machine can be connected (e.g., networked) to other machines in a local area network (LAN), an intranet, an extranet, and/or the Internet. The machine can operate in the capacity of a server or a client machine in a client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a network switch, a network bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage device 618, which communicate with each other via a bus 630.

The processing device 602 represents one or more general-purpose processing devices such as a microprocessor, a central processing unit, or the like. More particularly, the processing device 602 can be a complex instruction set computing (CISC) microprocessor, a reduced instruction set computing (RISC) microprocessor, a very long instruction word (VLIW) microprocessor, a processor implementing other instruction sets, or processors implementing a combination of instruction sets. The processing device 602 can also be one or more special-purpose processing devices such as an application specific integrated circuit (ASIC), a field programmable gate array (FPGA), a digital signal processor (DSP), a network processor, or the like. The processing device 602 is configured to execute instructions 626 for performing the operations and steps discussed herein. The computer system 600 can further include a network interface device 608 to communicate over a network 620.

The data storage device 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage device 618, and/or main memory 604 can correspond to the memory sub-system 110 of FIG. 1.

In one embodiment, the instructions 626 include instructions to implement functionality corresponding to activation of an operational profile as described herein (e.g., the profile-based operation adjuster 122 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system's memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. Such a computer program can be stored in a computer-readable storage medium, such as, but not limited to, any type of disk including floppy disks, optical disks, CD-ROMs, and magnetic-optical disks; read-only memories (ROMs); random access memories (RAMs); erasable programmable read-only memories (EPROMs); EEPROMs; magnetic or optical cards; or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description above. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine-readable (e.g., computer-readable) storage medium such as a read-only memory (ROM), random access memory (RAM), magnetic disk storage media, optical storage media, flash memory components, and so forth.

In the foregoing specification, embodiments of the disclosure have been described with reference to specific example embodiments thereof. It will be evident that various modifications can be made thereto without departing from embodiments of the disclosure as set forth in the following claims. The specification and drawings are, accordingly, to be regarded in an illustrative sense rather than a restrictive sense.

Examples

Example 1 is a system comprising: a memory component; and a processing device, operatively coupled to the memory component, configured to perform operations comprising: receiving, from a host system, a request to activate an operational profile for the system; adjusting a set of operational characteristics of the system based on the operational profile; and in response to successful completion of the adjusting the set of operational characteristics of the system based on the operational profile: storing, on non-volatile memory, an indication that the operational profile is active; and responding to the request by sending a request status to the host system.

In Example 2, the subject matter of Example 1 optionally includes the adjusting the set of operational characteristics of the system based on the operational profile comprises setting a set of operation variables of the system based on information from a profile table, the information corresponding to the operational profile, and the set of operation variables implementing at least some of the set of operational characteristics.

In Example 3, the subject matter of Example 1 or Example 2 optionally includes where the request comprises an AT Attachment command.

In Example 4, the subject matter of any one of Examples 1 to 3 optionally includes where the operational profile specifies a set of values for a set of operation variables of the system that cause the set of operational characteristics of the system to comprise slow data write speed to the memory component.

In Example 5, the subject matter of any one of Examples 1 to 4 optionally includes where the operational profile specifies a set of values for a set of operation variables of the system that cause the set of operational characteristics of the system to comprise prioritizing a data read operation for the memory component over a data write operation for the memory component.

In Example 6, the subject matter of any one of Examples 1 to 5 optionally includes where the operational profile specifies a set of values for a set of operation variables of the system that cause the set of operational characteristics of the system to comprise disablement of burst mode write operation for the memory component.

In Example 7, the subject matter of any one of Examples 1 to 6 optionally includes where the operational profile specifies a set of values for a set of operation variables of the system that cause the set of operational characteristics of the system to comprise enablement of sequential write mode operation for the memory component.

In Example 8, the subject matter of any one of Examples 1 to 7 optionally includes where the operational profile specifies a set of values for a set of operation variables of the system that cause the set of operational characteristics of the system to comprise workload optimization for endurance of the system.

In Example 9, the subject matter of any one of Examples 1 to 8 optionally includes where the operations further comprise: determining whether a set of conditions, for switching to another operational profile, is satisfied; and in response to determining that the set of conditions is satisfied: adjusting the set of operational characteristics of the system based on the other operational profile; and in response to successful completion of the adjusting the set of operational characteristics of the system based on the other operational profile, storing, on the non-volatile memory, an indication that the other operational profile is active.

In Example 10, the subject matter of any one of Examples 1 to 9 optionally includes where the processing device comprises a memory sub-system controller.

In Example 11, the subject matter of any one of Examples 1 to 10 optionally includes where the operations further comprise causing, based on the operational profile, the system to reboot after saving the active status of the operational profile to the non-volatile memory.

In Example 12, the subject matter of any one of Examples 1 to 11 optionally includes where the operations further comprise: after successful completion of a reboot of the system: determining whether the non-volatile memory is storing a given indication that a given operational profile is active; and in response to determining that the non-volatile memory is storing the active status of the given operational profile, adjusting the set of operational characteristics of the system based on the given operational profile.

Example 13 is a method comprising: receiving, from a host system, a request to activate an operational profile for a memory sub-system; adjusting a set of operational characteristics of the memory sub-system based on the operational profile; and in response to successful completion of the adjusting the set of operational characteristics of the system based on the operational profile, storing, on non-volatile memory of the memory sub-system, an indication that the operational profile is active.

In Example 14, the subject matter of Example 13 optionally includes where the operational profile specifies a set of values for a set of operation variables of the system that cause the set of operational characteristics of the system to comprise slow data write speed to a memory component of the memory sub-system.

In Example 15, the subject matter of Example 13 or Example 14 optionally includes where the operational profile specifies a set of values for a set of operation variables of the system that cause the set of operational characteristics of the system to comprise prioritizing a data read operation for a memory component of the memory sub-system over a data write operation for the memory component.

In Example 16, the subject matter of any one of Examples 13 to 15 optionally includes where the operational profile specifies a set of values for a set of operation variables of the system that cause the set of operational characteristics of the system to comprise disablement of burst mode write operation for a memory component of the memory sub-system.

In Example 17, the subject matter of any one of Examples 13 to 16 optionally includes where the operational profile specifies a set of values for a set of operation variables of the system that cause the set of operational characteristics of the system to comprise enablement of sequential write mode operation for a memory component of the memory sub-system.

In Example 18, the subject matter of any one of Examples 13 to 17 optionally includes where the operational profile specifies a set of values for a set of operation variables of the system that cause the set of operational characteristics of the system to comprise workload optimization for endurance of the system.

In Example 19, the subject matter of any one of Examples 13 to 18 optionally includes where the method further comprises determining whether a set of conditions, for switching to another operational profile, is satisfied; and in response to determining that the set of conditions is satisfied: adjusting the set of operational characteristics of the system based on the other operational profile; and in response to successful completion of the adjusting the set of operational characteristics of the system based on the other operational profile, storing, on the non-volatile memory, an indication that the other operational profile is active.

Example 20 is a non-transitory machine-readable storage medium comprising instructions that, when executed by a processing device, cause the processing device to perform operations comprising: receiving, from a host system, a request to activate a first operational profile for a memory sub-system; adjusting a set of operational characteristics of the memory sub-system based on the first operational profile; determining whether a set of conditions, for switching to a second operational profile, is satisfied; and in response to determining that the set of conditions is satisfied, adjusting the set of operational characteristics of the system based on the second operational profile.

What is claimed is:

1. A memory sub-system comprising:
   a memory component; and
   a processing device, operatively coupled to the memory component, configured to perform operations comprising:
      receiving, from a host system, a request to activate an operational profile for the memory sub-system;
      in response to the operational profile being available in a profile table stored on the memory sub-system:
         setting a set of operation variables of the memory sub-system based on information from a profile table stored on the memory sub-system, the profile table describing a plurality of available operational profiles that comprises the operational profile, the information corresponding to the operational profile, and the set of operation variables causing the memory sub-system to implement at least one target operational characteristic associated with the operational profile; and
         in response to successful completion of the setting of the set of operation variables based on the information:
            storing, on non-volatile memory, an indication that the operational profile is active; and
            responding to the request by sending to the host system a request status that indicates success of the request; and
      in response to the operational profile not being available in the profile table, responding to the request by sending to the host system a request status that indicates failure of the request.

2. The memory sub-system of claim 1, wherein the request comprises a user-defined command in accordance with an AT Attachment (ATA) specification, the user-defined command identifying the operational profile.

3. The memory sub-system of claim 1, wherein the information specifies a set of values for the set of operation variables that cause the memory sub-system to implement slow data write speed to the memory component.

4. The memory sub-system of claim 1, wherein the information specifies a set of values for the set of operation variables that cause the memory sub-system to prioritize a data read operation for the memory component over a data write operation for the memory component.

5. The memory sub-system of claim 1, wherein the information specifies a set of values for the set of operation variables that cause the memory sub-system to disable burst mode write operation for the memory component.

6. The memory sub-system of claim 1, wherein the information specifies a set of values for the set of operation variables that cause the memory sub-system to enable sequential write mode operation for the memory component.

7. The memory sub-system of claim 1, wherein the information specifies a set of values for the set of operation variables that cause the memory sub-system to implement workload optimization for endurance of the memory sub-system.

8. The memory sub-system of claim 1, wherein the operations comprise:
   determining whether a set of conditions, for switching to another operational profile, is satisfied; and in response to determining that the set of conditions is satisfied:
  setting another set of operation variables of the memory sub-system based on other information from the profile table, the other information corresponding to the other operational profile, and the other set of operation variables causing the memory sub-system to implement at least another target operational characteristic associated with the other operational profile; and
  in response to successful completion of the setting of the set of operation variables based on the other information, storing, on the non-volatile memory, an indication that the other operational profile is active.

9. The memory sub-system of claim 1, wherein the processing device comprises a memory sub-system controller.

10. The memory sub-system of claim 1, wherein the operations comprise:
  causing, based on the information, the memory sub-system to reboot after saving an active status of the operational profile to the non-volatile memory.

11. The memory sub-system of claim 10, wherein the operations comprise:
  after successful completion of a reboot of the memory sub-system:
  determining whether the non-volatile memory is storing a given indication that a given operational profile is active; and
  in response to determining that the non-volatile memory is storing an active status of the given operational profile, setting another set of operation variables of the memory sub-system based on the given operational profile.

12. A method comprising:
  receiving, from a host system, a first request to activate a first operational profile for a memory sub-system;
  in response to the first operational profile being available in a profile table stored on the memory sub-system:
  setting a set of operation variables of the memory sub-system based on information from a profile table stored on the memory sub-system, the profile table describing a plurality of available operational profiles that comprises the first operational profile, the information corresponding to the first operational profile, and the set of operation variables causing the memory sub-system to implement at least one target operational characteristic associated with the first operational profile; and
  in response to successful completion of the setting of the set of operation variables based on the information, storing, on non-volatile memory of the memory sub-system, an indication that the first operational profile is active;
  receiving, from the host system, a second request to activate a second operational profile for the memory sub-system; and
  in response to the second operational profile not being available in the profile table, responding to the second request by sending to the host system a second request status that indicates failure of the second request.

13. The method of claim 12, wherein the information specifies a set of values for the set of operation variables that cause the memory sub-system to implement slow data write speed to a memory component of the memory sub-system.

14. The method of claim 12, wherein the information specifies a set of values for the set of operation variables that cause the memory sub-system to prioritize a data read operation for a memory component of the memory sub-system over a data write operation for the memory component.

15. The method of claim 12, wherein the information specifies a set of values for the set of operation variables that cause the memory sub-system to disable burst mode write operation for a memory component of the memory sub-system.

16. The method of claim 12, wherein the information specifies a set of values for the set of operation variables that cause the memory sub-system to enable sequential write mode operation for a memory component of the memory sub-system.

17. The method of claim 12, wherein the information specifies a set of values for the set of operation variables that cause the memory sub-system to implement workload optimization for endurance of the memory sub-system.

18. The method of claim 12, further comprising:
  determining whether a set of conditions, for switching to another operational profile, is satisfied; and
  in response to determining that the set of conditions is satisfied:
  setting another set of operation variables of the memory sub-system based on other information from the profile table, the other information corresponding to the other operational profile, and the other set of operation variables causing the memory sub-system to implement at least another target operational characteristic associated with the other operational profile; and
  in response to successful completion of the setting of the other set of operation variables based on the other information, storing, on the non-volatile memory, an indication that the other operational profile is active.

19. A non-transitory machine-readable storage medium comprising instructions that, when executed by a processing device of a memory sub-system, cause the processing device to perform operations comprising:
  receiving, from a host system, a request to activate a fir-st operational profile for the memory sub-system;
  in response to the operational profile being available in a profile table stored on the memory sub-system:
  setting a first set of operation variables of the memory sub-system based on first information from a profile table stored on the memory sub-system, the information corresponding to the first operational profile, and the first set of operation variables causing the memory sub-system to implement at least a first one target operational characteristic associated with the first operational profile; and
  in response to successful completion of the setting of the set of operation variables based on the information:
    storing, on non-volatile memory, an indication that the operational profile is active; and
    responding to the request by sending to the host system a request status that indicates success of the request; and
  in response to the operational profile not being available in the profile table, responding to the request by sending to the host system a request status that indicates failure of the request.

20. The non-transitory machine-readable storage medium of claim 19, wherein the request comprises a user-defined command in accordance with an AT Attachment (ATA) specification, the user-defined command identifying the first operational profile.

* * * * *